United States Patent

[11] 3,588,706

[72] Inventors Yasuhide Sakai
Kawasaki-shi;
Yoshinori Takagi; Masahiro Watanabe,
Yokohama, Japan
[21] Appl. No. 743,463
[22] Filed July 9, 1968
[45] Patented June 28, 1971
[73] Assignee Matsushita Electric Industrial Co., Ltd.
Osaka, Japan
[32] Priority July 24, 1967, July 28, 1967
[33] Japan
[31] 42/48044 and 42/65772

[54] AUTOMATIC TUNING RECEIVER
9 Claims, 9 Drawing Figs.

[52] U.S. Cl. ........ 325/417, 325/418, 325/422, 325/423, 325/332, 325/452, 325/453, 325/454, 325/457, 325/464, 325/465, 334/15

[51] Int. Cl. ........ H04b 1/16

[50] Field of Search ........ 325/332, 335, 341, 346, 416—419, 422, 423, 452, 453, 457, 458, 464, 465, 468, 470—474, 459, 462, 454; 334/14, 15, 18

[56] References Cited

UNITED STATES PATENTS

| | | | |
|---|---|---|---|
| 3,007,044 | 10/1961 | Cookson | 325/453 |
| 3,069,637 | 12/1962 | Seeley | 325/423 |
| 3,204,207 | 8/1965 | Denker | 325/468 |
| 3,233,179 | 2/1966 | Klettke | 325/422 |
| 3,440,544 | 4/1969 | Pampel | 325/453 |
| 3,447,087 | 5/1969 | Takezaki et al. | 325/453 |

*Primary Examiner*—Robert L. Griffin
*Assistant Examiner*—Albert J. Mayer
*Attorney*—Stevens, Davis, Miller and Mosher

ABSTRACT: An automatic tuning receiver wherein the reactance value of a tuning circuit is varied in accordance with a control signal consisting of a current or voltage to thereby effect tuning control, thus making it possible to easily perform the sweep with respect to a desired broadcast signal.

AUTOMATIC TUNING RECEIVER

This invention relates to an automatic tuning radio receiver wherein as tuning elements for the tuning circuits, use is made of variable reactance elements of which the reactance value is varied in accordance with a control signal consisting of a current or voltage imparted thereto.

As is well known in the art, with such receiver, a desired broadcast can be received in accordance with the reactance value of variable reactance elements which is controlled by a sweep voltage or current supplied thereto.

However, it is impossible to select a particular radio wave out of a multiplicity of radio waves and tune in the thus selected radio wave at a time, since the tuning selection is effected by sequentially sweeping the radio waves in accordance with a sweep voltage or current.

Accordingly, it is a primary object of this invention to provide an automatic tuning receiver which is capable of easily effecting reception of a desired broadcast.

Another object of this invention is to provide an automatic tuning receiver wherein even if the field intensity of a radio wave decreases during the reception, the tuned state can be stably maintained until the filed intensity increases up to the original value.

Other objects, features features and advantages of the present invention will become apparent from the following description taken in conjunction with the accompanying drawings, which:

Description will first be made of the embodiment shown in FIG. 1 wherein sue is made of current-controlled reactance elements as tuning element.

Figure 1:
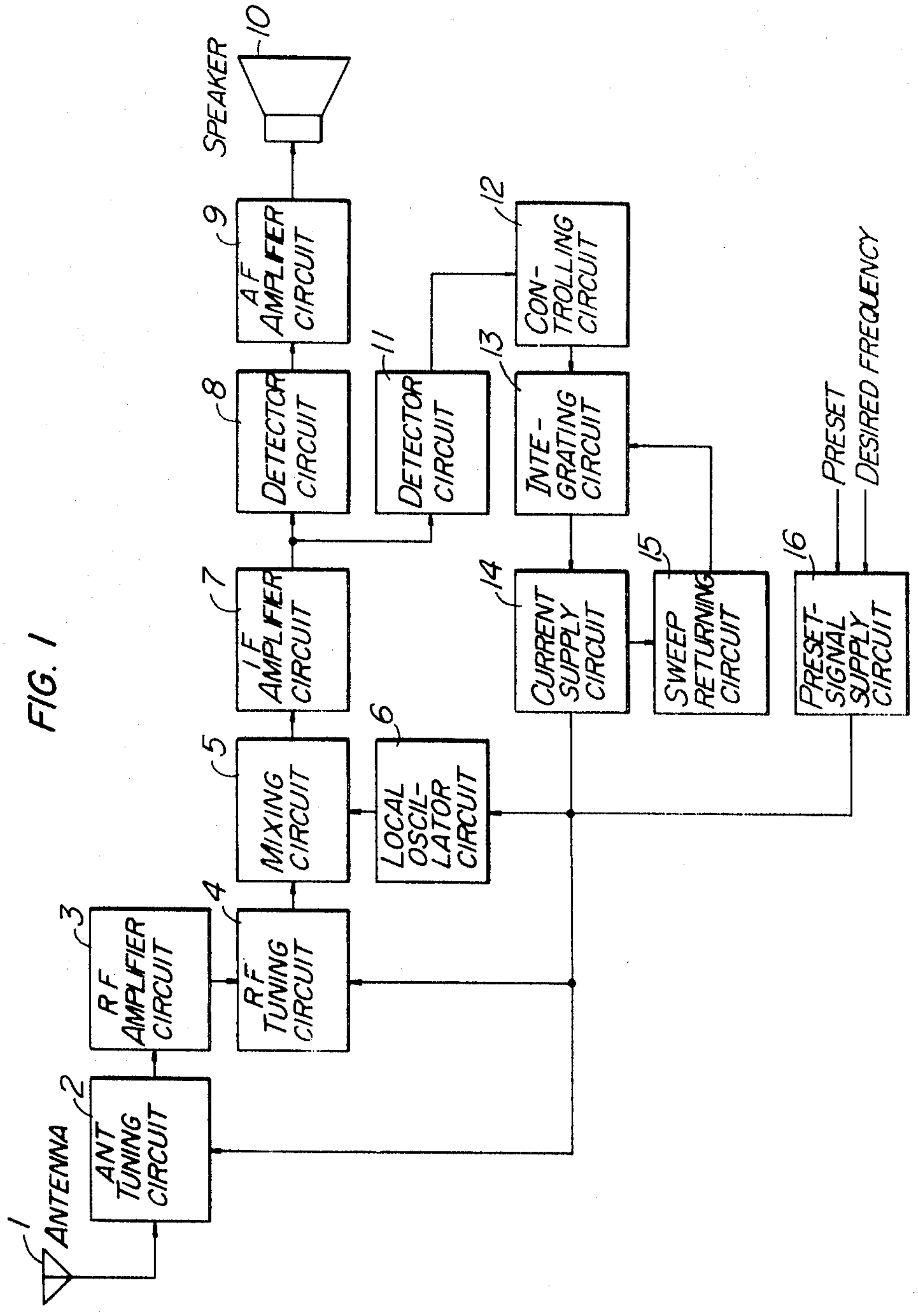
FIG. 1 is a block diagram showing an automatic tuning receiver according to an embodiment of the present invention.

Referring to FIG. 1, the reference numeral 1 represents an antenna, 2 an antenna tuning circuit, 3 a high radio frequency amplifier circuit, 4 a radio frequency tuning circuit, 5 a mixing circuit, 6 a local oscillator circuit, 7 an intermediate-frequency amplifier circuit, 8 a detector circuit, 9 an audio frequency amplifier circuit, and 10 a speaker. The above arrangement is similar to that of an ordinary superheterodyne receiver. The reference numeral 11 denotes an intermediate-frequency narrow-band detector circuit 12, a charge-discharge controlling circuit, 13 an integrating circuit, 14 a tuned frequency fine-adjusting current supply circuit, 15 an automatic sweep returning circuit, and 16 a preset signal supply circuit.

Figure 2:
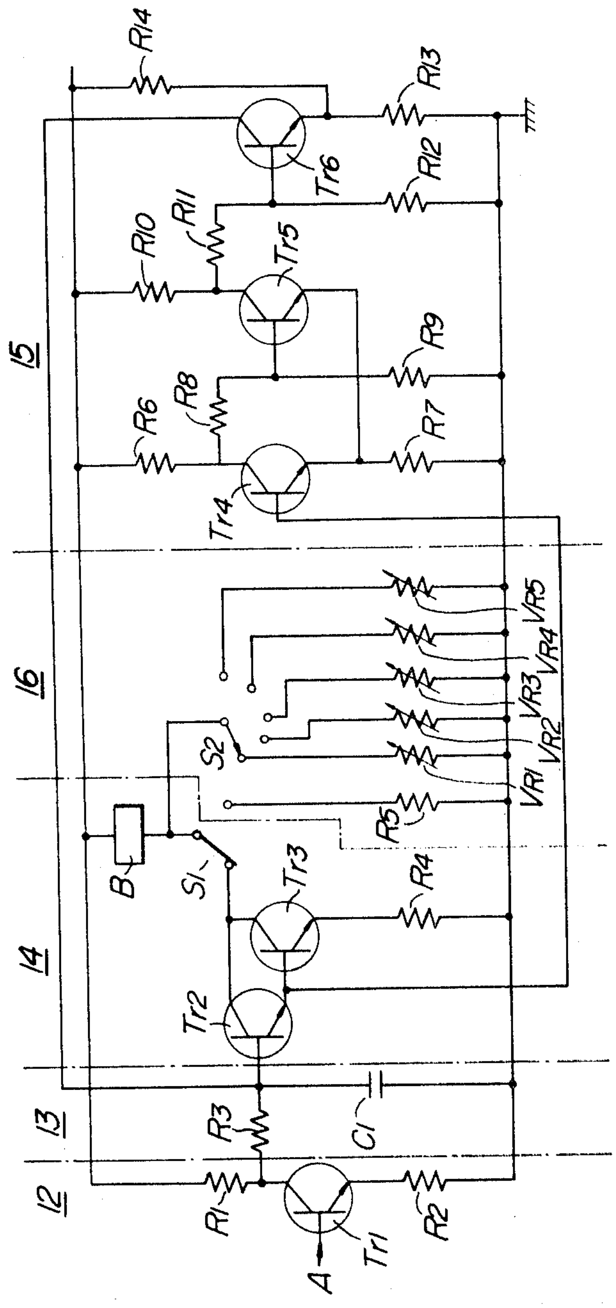
FIG. 2 is a circuit diagram showing the automatic tuning portion of the receiver shown in FIG. 1.
Figure 3:
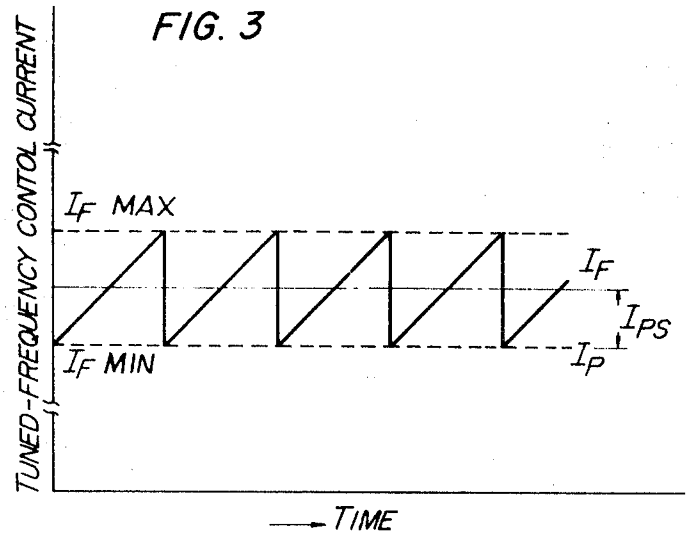
FIGS. 3 and 4 are views showing the operational characteristics thereof.

FIG. 2 shows an example of circuit including the elements 12 to 16 shown in block form in FIG. 1. In the charge-discharge controlling circuit 12, $Tr_1$ is a charge-discharge controlling transistor which is controlled by an output *A* resulting from the intermediate-frequency narrow-band amplification and detection, and $R_1$ and $R_2$ a collector resistor and an emitter resistor of the transistor $Tr_1$ respectively. In the integrating circuit 13, $R_3$ is a resistor constituting part of the integrating circuit, and $C_1$ a capacitor forming the integrating circuit together with the resistor $R_3$. In the tuned frequency fine-adjusting current supply circuit 14, $Tr_2$ and $Tr_3$ are control current supplying transistors which are under the control of a voltage charged at the capacitor $C_1$ of the integrating circuit, $R_4$ an emitter resistor for the transistor $Tr_3$, *B* a current-controlled variable reactance unit which includes tuning elements constituting the tuning circuits for the antenna tuning circuit 2, radiofrequency tuning circuit 4 and local oscillator circuit 6, and $S_1$ a switching element which is so designed that it is engaged with a contact connected with a resistor $R_5$ only in case the receiver is preset to a desired frequency so that such a preset auxiliary current ($I_{PS}$) as shown in FIG. 3 is supplied to the variable reactance element *B* therethrough while in the other case it is engaged with another contact connected with the transistor $Tr_3$ so that such a tuned frequency fine-adjusting current ($I_F$) as shown in FIG. 3 is supplied to the variable reactance unit *B* therethrough. In the preset current supplying circuit 16, $VR_1$ to $VR_5$ are variable resistors for changing a preset current ($I_P$) as shown in FIG. 3, $S_2$ a selector switch for selectively connecting one of the variable resistors $VR_1$ to $VR_5$ with the variable reactance element *B*. In the automatic sweep returning circuit 15, $Tr_4$ and $Tr_5$ are transistors constituting a Schmitt circuit which is controlled by a voltage between the emitter of the transistor $Tr_2$ and the ground, $R_6$ to $R_{10}$ auxiliary resistors for determining the operating level of the Schmitt circuit, $Tr_6$ a transistor for discharging the capacitor $C_1$ and which is controlled by the operation of the Schmitt circuit, and $R_{11}$ to $R_{14}$ auxiliary resistors for determining the operating level of the transistor $Tr_6$.

Figure 4:
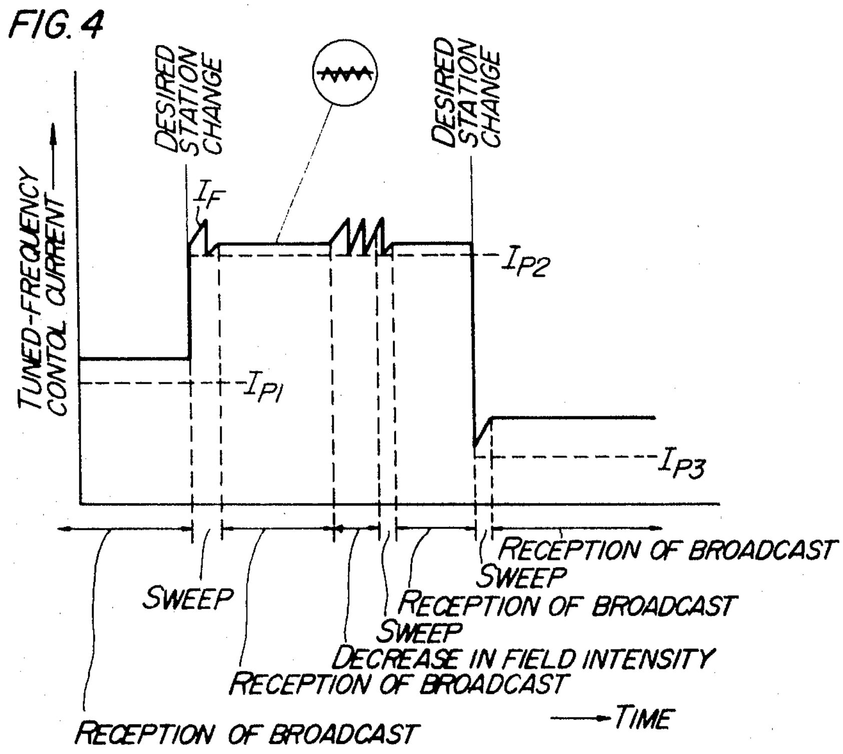

The operation of the circuit shown in FIGS. 1 and 2 will now be described by referring to the operational characteristics of FIGS. 3 and 4. In an attempt to preset the receiver to a desired frequency, the switch $S_1$ is engaged with the contact connected with the resistor $R_5$, and the selector switch $S_2$ is connected with that one of the variable resistors $Vr_1$ to $VR_5$ which corresponds to the desired frequency. Thus, a current $I_P+I_{PS}$ which is the sum of the preset auxiliary current $I_{PS}$ (set to about $I_{Fmax}/2$) flowing through the resistor $R_5$ and the preset current $I_P$ flowing through the variable resistor VR selected by the selector switch $S_2$ flows through the variable reactance unit *B*. At this point, the preset current $I_P$ is changed by changing the resistance value of the selected variable resistor VR for adjusting the received frequency to the frequency of a desired broadcast, and upon reception of the desired broadcast, the switch $S_1$ is switched to the transistor $Tr_3$ side. By performing the foregoing operation with respect to the variable resistors $VR_1$ to $VR_5$, five different broadcast signal frequencies can be preset.

The selection of a desired broadcast signal frequency can be achieved by choosing that one of the variable resistors $VR_1$ to $VR_5$ which corresponds to the desired broadcast signal frequency by means of the selector switch $S_2$. At this point, a current which is the sum of the preset current depending upon the resistance value of the variable resistor VR and the tuned frequency fine-adjusting current $I_F$ under the control of the voltage charged at the capacitor $C_1$ flows through the variable reactance unit *B*. The sweep of the current $I_F$ is repeated by the charge-discharge controlling circuit 12 and sweep returning circuit 15 until a desired broadcast signal is received. Upon reception of the desired broadcast signal, the output *A* resulting from the intermediate-frequency narrow-band amplification and detection exceeds a predetermined level, whereby the transistor $Tr_1$ is rendered conductive so that the charging at the capacitor $C_1$ which has been effected through the resistors $R_1$ and $R_3$ prior to the reception is interrupted. The voltage across the capacitor $C_1$ tends to drop due to the leakage of the capacitor itself and the discharge through a path consisting of resistor $R_3$–transistor $Tr_1$–resistor $R_2$ and through a path consisting of transistor $Tr_2$–$Tr_3$–resistor $R_4$. Such tendency leads to a decrease of the fine-adjusting current $I_F$ which is supplied to the variable reactance elements by the transistors $Tr_2$ and $Tr_3$, so that deviation of the tuned frequency tends to occur. In this case, however, the level of the intermediate frequency narrow-band detection output *A* decreases to such an extent that the transistor $Tr_1$ is again rendered nonconductive. Thus, the capacitor $C_1$ is charged to cause the fine-adjusting current $I_F$ to be increased again, thus preventing a tuned-frequency deviation from occurring.

The repetition of the operation described above results in continued reception of a desired broadcast signal. In case the field intensity decreases during the reception, the intermediate-frequency narrow-band detection output *A* goes below a predetermined level so that the transistor $Tr_1$ is rendered nonconductive to cause the capacitor $C_1$ to be charged, thus resulting in a repetitive sweep of the fine-adjusting current $I_F$. However, since the sweep width is of a predetermined value, it is possible to receive the original broadcast signal upon the return of the field intensity to the original value, unless another broadcast wave is present in the frequency band corresponding corresponding to the sweep width (see FIG. 4). This is also true of the case where an attempt is made to lock the desired frequency after the power source is turned off.

Figure 5:
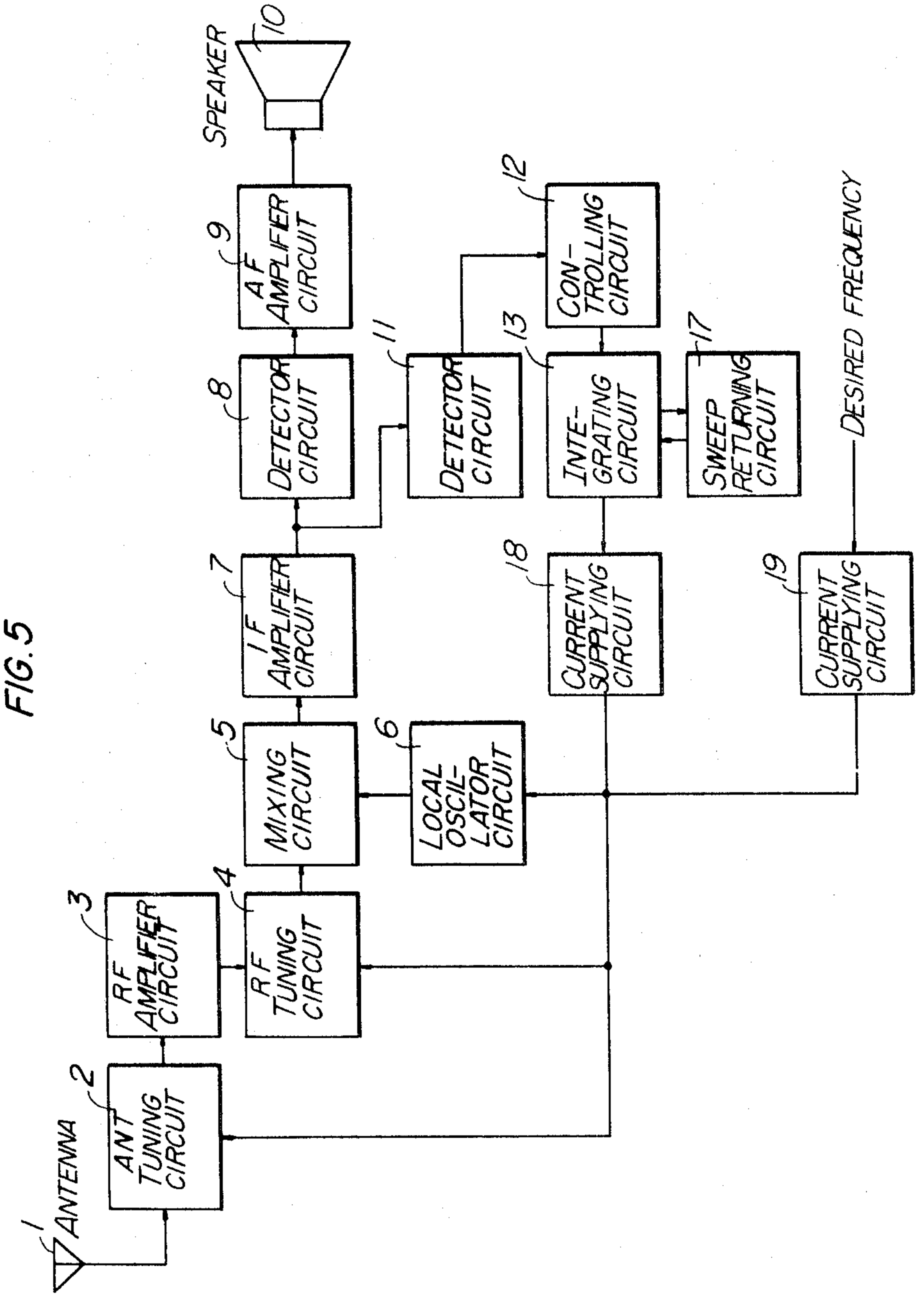
FIG. 5 is a block diagram showing an automatic tuning receiver according to a second embodiment of the present invention.

FIG. 5 shows a second embodiment of the present invention. In FIG. 5, the reference numerals 1 to 13 represent elements which are similar to those indicated by 1 to 13 in FIG. 1 respectively, and therefore description thereof will be omitted. The reference numeral 17 represents an automatic sweep returning circuit, 18 a divided frequency band sweep current supplying circuit, and 19 a received frequency band setting current supplying circuit for setting the received frequency band for the divided frequency band sweep.

Figure 6:
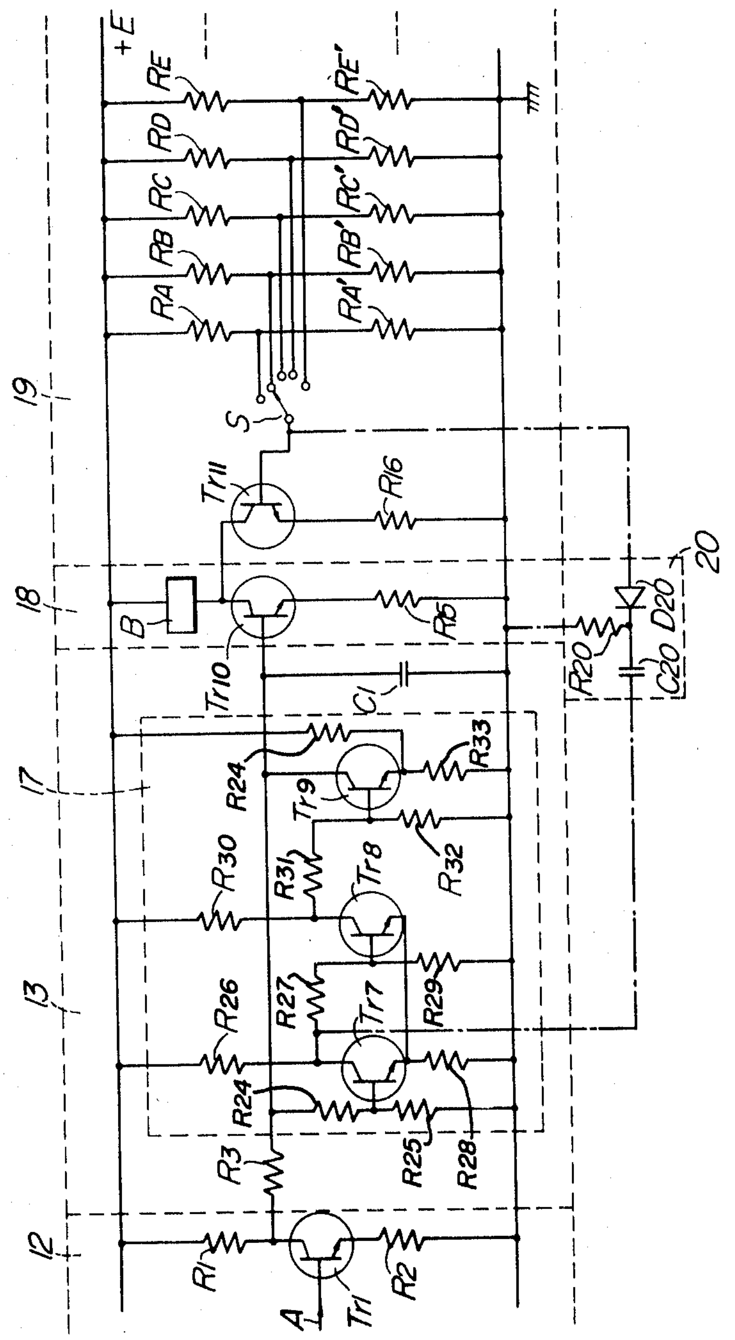
FIG. 6 is a circuit diagram showing the automatic tuning circuit of the receiver shown in FIG. 5.
Figure 7:
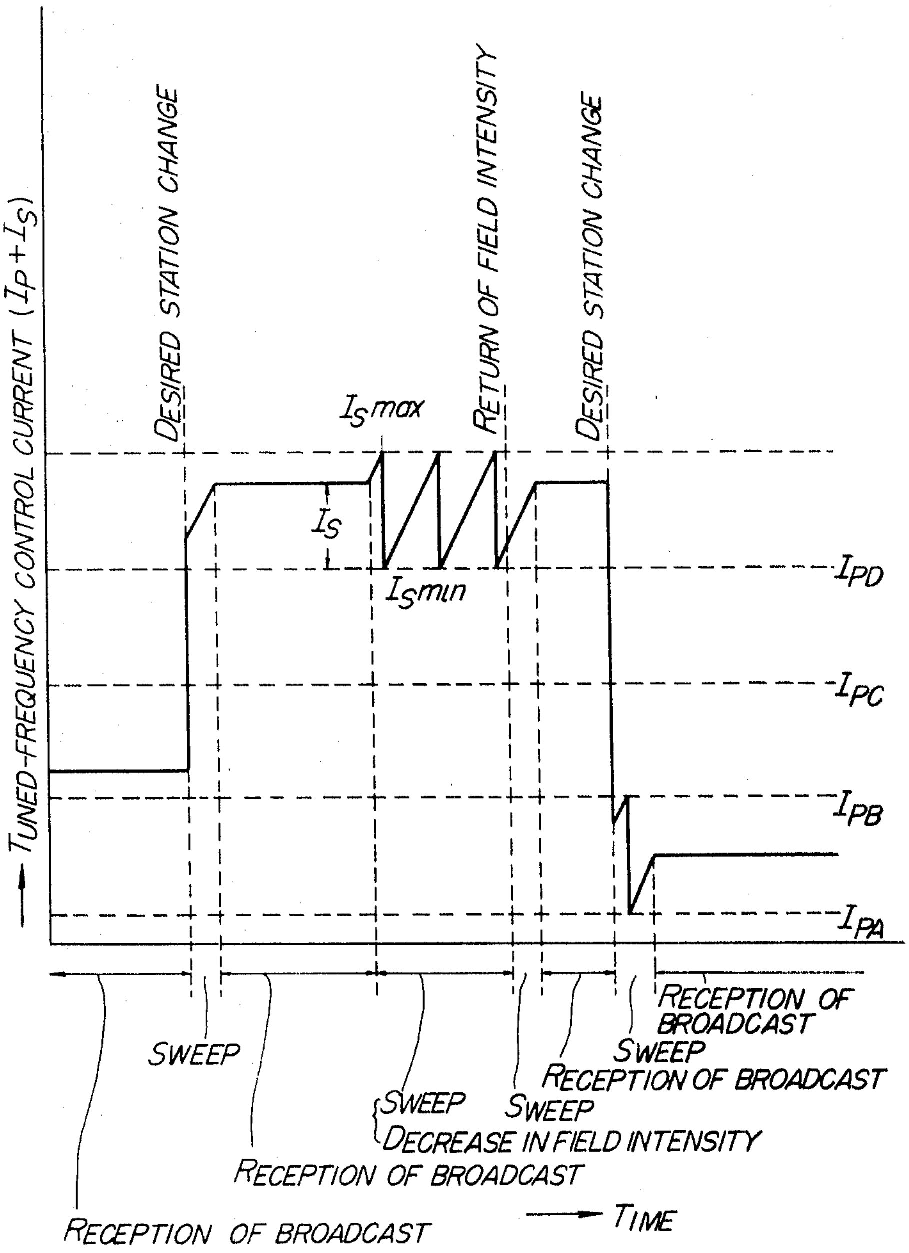
FIG. 7 is a view showing the operational characteristics thereof.

FIG. 6 shows a concrete example of circuit arrangement of the blocks 12, 13, 17, 18 and 19 shown in FIG. 5. In the charge-discharge controlling circuit 12, $Tr_1$ is a charge-discharge controlling transistor which is controlled in accordance with an output *A* resulting from the intermediate-frequency narrow-band amplification and detection, and $R_1$ and $R_2$ a collector resistor and an emitter resistor for the transistor $Tr_1$ respectively, In the integrating circuit 13, $R_3$ is a resistor forming the integrating circuit together with a capacitor $C_1$. In the automatic sweep returning circuit 17, $Tr_7$ and $Tr_8$ are transistors constituting a Schmitt circuit which is under the control of a voltage charged at the capacitor $C_1$ of the integrating circuit 13, $R_{24}$ to $R_{30}$ auxiliary resistors for determining the operating level of the Schmitt circuit, $Tr_9$ a transistor (sweep returning transistor) for causing the capacitor $C_1$ to be discharged and which is controlled by the operations of the Schmitt circuit, and $R_{31}$ to $R_{34}$ auxiliary resistors for determining the operating level of the transistor $Tr_9$. In the divided frequency band sweep current supplying circuit 18, $Tr_{10}$ is a control current supplying transistor which is controlled by the voltage charged at the capacitor $C_1$ of the integrating circuit, $R_{15}$ an emitter resistor for the transistor $Tr_{10}$, and *B* current-controlled variable reactance unit inserted in the collector circuit of the transistor $Tr_{10}$ and which serves as the tuning element for the antenna tuning circuit 2, radiofrequency tuning circuit 4 and local oscillator circuit 6. In the received frequency band setting current supplying circuit 19, $R_AR_A'$, $R_BR_B'$, $R_CR_C'$,....... are control resistance blocks for supplying received frequency setting currents $I_{PA}$, $I_{PB}$, $I_{PC}$, ....... as shown in FIG. 7, $Tr_{11}$ a band setting current supplying transistor for imparting to the current-controlled variable reactance unit or elements a received frequency band setting current which is determined by the received frequency band setting current controlling resistance blocks $R_AR_A'$, $R_BR_B'$, $R_CR_C'$, ......., $R_{16}$ an emitter resistance for the transistor $Tr_{11}$, and *S* a selector switch for selecting the resistors $R_AR_A'$, $R_BR_B'$, $R_CR_C'$, ........ The operation of the circuit shown in FIGS. 5 and 6 will now be described, with reference to the operational characteristics shown in FIG. 7.

The selection of a desired broadcast signal can be effected by selecting that one of the resistance blocks $R_AR_A'$, $R_BR_B'$, $R_CR_C'$, ....... (indicated by RR' hereinafter) which corresponds to the desired broadcast by means of the selector switch *S*. Thus, a received frequency band setting current $I_P$depending upon the resistance of the selected reception block RR' and a divided frequency band sweep current $I_S$ controlled in accordance with the voltage charged at the capacitor $C_1$ will flow through the variable reactance unit *B*, and the sweep of the current $I_S$ is repeatedly effected by the charge-discharge controlling circuit 12 and the automatic sweep returning circuit 17 until the signal of a desired broadcast is received. Upon reception of the desired broadcast signal, the intermediate frequency narrow-band amplification and detection output *A* exceeds a predetermined level to cause the transistor $Tr_1$ to be rendered conductive so that the charging at the capacitor $C_1$ which has been effected through the resistors $R_1$ and $R_3$ prior to the reception is stopped. As a result, the repeated sweep of the divided frequency band sweep current $I_S$ is also stopped. At this point, the voltage charged at the capacitor $C_1$ tends to drop due to leakage of the capacitor $C_1$ itself and the discharge through a path consisting of resistor $R_3$–transistor $Tr_1$–resistor $R_2$, a path consisting of resistor $R_{24}$–$R_{25}$, and a path consisting of transistor $Tr_{10}$–resistor $R_{15}$. Thus, the divided frequency sweep current $I_S$ supplied to the variable reactance unit *B* begins to decrease so that there occurs such a tendency that the tuned frequency is deviated. This results in a decrease of the level of the intermediate-frequency narrow-band detection output *A*, whereby the transistor $Tr_1$ is rendered nonconductive so that the capacitor $C_1$ is charged and the divided-frequency band sweep current $I_S$ is again increased. Thus, the tuned-frequency deviation is prevented.

Figure 8:
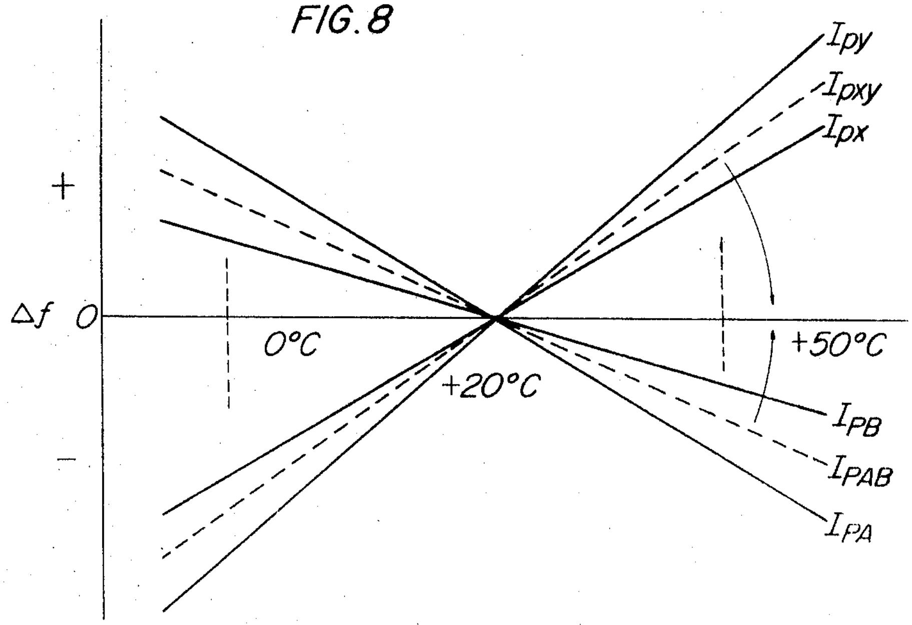
FIG. 8 is a view showing the temperature characteristic of a current-controlled variable reactance element.

Repetition of the operation described above results in continued reception of desired broadcast signals. If the field intensity decreases, then the intermediate-frequency narrow-band detection output *A* goes below a predetermined level, so that the transistor $Tr_1$ is rendered nonconductive and the capacitor $C_1$ is charged, thus resulting in a repeated sweep of the sweep current $I_S$. Since the sweep width of the current $I_S$ is constant, however, the original broadcast signal can be received upon the return of the field intensity to the original value, unless other broadcast signals are present in the frequency band corresponding to the sweep width of the current $I_S$ (see FIG. 7). This is also true of the case where an attempt is made to lock the frequency after the power source has once been turned off. Frequency indication can be achieved by setting the received frequency controlling current (divided frequency band sweep current $I_S$ plus received frequency band setting current $I_P$) to cover the entire MW reception to such a value that the entire MW reception range can be covered by changing over the selector switch *S* associated with the received frequency band setting resistance blocks RR' and indicating on the selector switch the received frequency band width corresponding to the sum of the received frequency band setting current controlled by each resistance block RR' and the divided frequency band sweep current. However, the possibility may occur that the received frequency indicated by the selector switch becomes greatly different from the actually received frequency due to variations in ambient temperature, since the frequency tuned by the current-controlled variable reactance elements is greatly varied depending upon temperature and the frequency variation characteristic thereof becomes different depending upon the value of a current supplied thereto (or tuned frequency), as shown in FIG. 8. This problem can be solved by adding a temperature-compensating element corresponding to each received frequency band setting current to each received frequency band setting resistance block RR' or substituting the former for the latter. (For example, the temperature compensation is so effected that the temperature characteristic of the current controlled variable reactance elements for the current $I_P+I_{Smax}/2$ becomes zero with respect to each $I_P$.) In FIG. 6, the reference numeral 20 represents a received frequency band setting current cutoff circuit including a differentiating circuit constituted by a capacitor $C_{20}$and resistor $R_{20}$, and a diode $D_{20}$enabling only negative pulses to be supplied from the Schmitt circuit in the automatic sweep returning circuit 17 to the received frequency band setting current supplying circuit 19.

If the divided frequency band sweep current $I_S$assumes the maximum value $I_{Smax}$during the frequency sweep, then the sweep returning circuit 17 is operated, and at this point a negative pulse is imparted to the transistor $Tr_{11}$ of the received frequency band setting current supplying circuit 19 to temporarily render the transistor $Tr_6$ nonconductive so that the received frequency band setting current is temporarily cut off. Upon completion of the sweep return, the cutoff of the received frequency band setting current is stopped, and the divided frequency band sweep current $I_S$ is added to the received frequency band setting current $I_P$ occurring prior to the cutoff, with the result that the sweep is started with $I_{Smin}$. Thus, it is possible to eliminate tracking errors, frequency indication errors and so forth which tend to occur in the case of the FIG. 5 embodiment. Although in the embodiments of FIGS. 2 and 6, use was made of current-controlled variable reactance elements, it is also possible to use voltage-controlled variable reactance elements.

Figure 9:
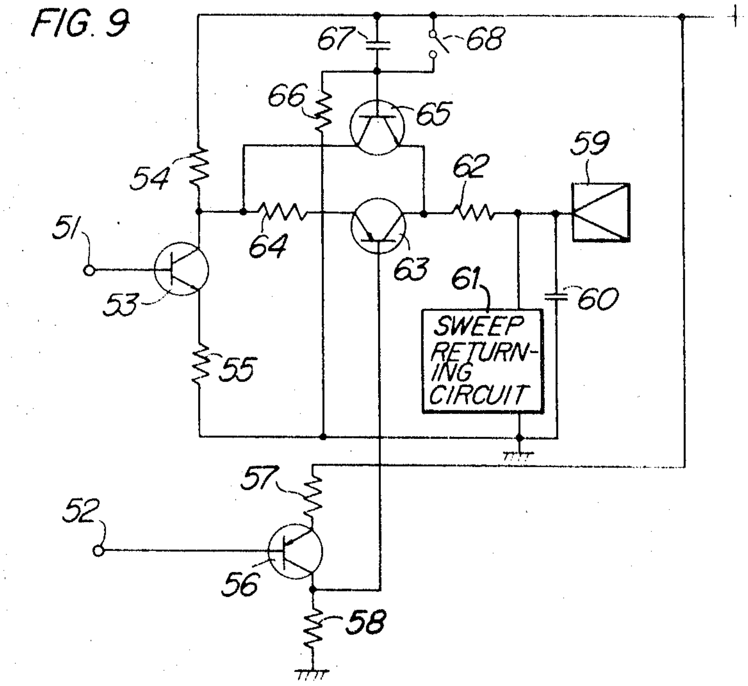
FIG. 9 is a circuit diagram showing the automatic tuning portion of an automatic tuning receiver according to a third embodiment of the present invention.

FIG. 9 shows a circuit which is so designed that when the field intensity is lowered during the reception of a broadcast signal, the sweep current (voltage) is held until the return of the field intensity to the original value. Referring to FIG. 9, the reference numeral 51 represents a terminal to which is applied the intermediate-frequency narrow-band detection output, 52 a terminal to which an AGC output is applied, 53 a charge-discharge controlling transistor controlled by the narrow-band detection output supplied from the terminal 51 thereto, 54 and 55 collector and emitter resistors for the transistor 53 respectively, 56 a transistor controlled by the AGC output, 57 and 58 emitter and collector resistors for the transistor 56 respectively, 59 a buffer amplifier supplying the charges at a capacitor 60 to the variable reactance elements provided in the tuning circuit in the form of a sweep current (voltage), 61 an automatic sweep returning circuit connected in parallel with the capacitor 60 for causing the capacitor 60 to be discharged to 0 or a quantity in the vicinity of zero when the quantity of charges at the capacitor 60 reaches a predetermined value, 62 a resistor constituting an integrating circuit together with the capacitor 60, 63 a erroneous sweep preventing gate transistor which is under the control of the transistor 56, 64 an emitter resistor for the transistor 63, 65 a sweeping transistor, 66 a resistor for determining the sweep time together with a capacitor 67, and 68 a sweep start switch which is normally open and is connected in parallel with the capacitor 67. It should be noted that the elements 56 to 68 constitute a sweep circuit, while the elements 56 to 58, 63 and 64 constitute an erroneous sweep preventing gate circuit.

Description will be made of the operation of the foregoing arrangement. By momentarily turning on the sweep start switch 68 the charges at the capacitor 67 are discharged so that the transistor 65 is rendered conductive, whereupon the capacitor 60 is charged through the resistor 54, the transistor 65 and resistor 62. Thus, the sweeping operation is ready to be initiated.

Upon reception of a certain broadcast signal, the transistor 53 is rendered conductive, while the transistor 56 is made nonconductive. Consequently, the transistor 63 is rendered conductive. The collector potential of the transistor 65 is decreased to a value close to the ground potential concurrently with the conduction of the transistor 53, since the collector of the transistor 65 is connected with the collector of the transistor 53. Thus, the capacitor 67 is momentarily charged through the base and collector of the transistor 65, transistor 53 and the resistor 55 to such an extent that the transistor 65 is cut off or becomes nonconductive due to the potential across the charged capacitor 67. Thus, the transistor 65 remains in the nonconductive state without effecting any sweeping operation until the sweep start switch is again actuated. Consequently, the receiver is in the receiving state. At this point, if the field intensity decreases, the transistor 56 is rendered conductive to make the transistor 63 nonconductive. Therefore, even if the transistor 53 is rendered nonconductive, the charge at the capacitor 60 will not be discharged through a path consisting of resistor 62—transistor 63—resistor 64—transistor 53—resistor 55, but the charged voltage of said capacitor will be maintained thereat. Upon the return of the field intensity to its original value, the transistor 56 is turned off, while the transistor 63 is turned on. Thus the receiver is returned to its normal receiving state.

As described above, in accordance with the present invention, in order to selectively receive a broadcast wave E out of broadcast waves B, C, D and E during the reception of a broadcast A, the desired wave E can easily be received by selecting the selector switch corresponding thereto. Furthermore, even if the field intensity decreases, the broadcast wave can easily be locked until the return of the field intensity to the original value.

We claim:

1. An automatic tuning receiver, comprising, in combination, antenna tuning circuits, a radio frequency amplifier, an oscillator, a mixing circuit, an intermediate frequency tuning amplifier, a detector, and an audio frequency amplifier and output circuit, variable reactance elements provided in each resonance circuit of said antenna tuning circuits, said radio frequency circuit and said oscillator circuit, means electronically varying the reactance values of said variable reactance elements, detecting and amplifying circuit means for further amplifying and detecting a part of an output of the intermediate frequency tuning amplifier circuit, charge-discharge control circuit means controlled by the level of an output at said amplifying and detecting circuit, means causing said charge-discharge control circuit to conduct when said output of the amplifying and detecting circuit is above a predetermined level, means rendering said charge-discharge control circuit nonconductive when said output is below the predetermined level, an integrating circuit including a resistor and a capacitor, the charged voltage of said capacitor being controlled by said charge-discharge control circuit, buffer amplifier means for converting the charged voltage of said capacitor into a control signal controlling said reactance elements, a received frequency band setting device having a group of fixed resistors and a group of selector switch means, said device having means to divide the overall frequency band capable of being received by the receiver into a required number of received frequency narrow bands to produce a fixed control signal corresponding to the lower limit of the received frequency in each of the received frequency narrow bands, means to superimpose said control signal on an output of said buffer amplifier to supply it to said variable reactance elements, and a sweep returning circuit connected in parallel to said capacitor, said circuit including means to discharge the charge of said capacitor to a level corresponding to said lower limit frequency of the selected frequency band when said control signal produced in a accordance with the voltage of the charged capacitor reaches a level corresponding to the upper limit frequency in the selected frequency band, thus maintaining said control signal within said selected received frequency band.

2. An automatic tuning receiver according to claim 1, further comprising selector switch means for indicating a received frequency band in accordance with the changeover of said selector switch means.

3. An automatic tuning receiver according to claim 1 further comprising temperature compensating elements putting in said group of resistors constituting part of the received frequency band setting circuit for compensating for deviations of a received frequency stemming from variations in the reactance of said variable reactance elements due to temperature variations in the respective received frequency bands.

4. An automatic tuning receiver according to claim 1, further comprising cutoff circuit means cutting off the control signal fed to said variable reactance elements in synchronism with the sweep return whenever the latter occurs.

5. An automatic tuning receiver according to claim 1, further comprising an erroneous sweep preventing gate provided between said charge-discharge control circuit and the capacitor constituting part of the integrating circuit in series, including means to maintain said charge-discharge control circuit in its on state when the field intensity of the received broadcast is above a predetermined level, and means to maintain said charge-discharge control circuit in its off state when said filed intensity is below the predetermined level.

6. An automatic tuning receiver according to claim 5, further comprising a sweep circuit connected in parallel with said erroneous sweep preventing gate, means to sweep said circuit upon actuation by a sweep start switch, means to maintain said sweep circuit in the nonsweep state when said charge-discharge control circuit is maintained in its nonconductive state by reception of a broadcast wave, and means holding said sweep circuit in said nonsweep state until said sweep start switch is actuated again.

7. An automatic tuning receiver according to claim 1, in which variable resistors are used as the fixed resistors constituting part of the received frequency band setting device, whereby the control signal for setting a narrow received frequency band is made variable externally of the receiver.

8. An automatic tuning radio receiver, comprising variable reactance elements provided in tuning circuits, means to electronically vary the reactance value of said variable reactance elements, an integrating circuit, charge-discharge control circuit means controlled by a received signal, said control circuit means controlling the charge and discharge of said integrating circuit and the output of said control circuit being integrated by said integrating circuit, buffer amplifier means supplying a control signal in accordance with the voltage of said integrating circuit to said variable elements, automatic sweep retuning circuit means for maintaining said control signal within a predetermined sweep width, and preset circuit means supplying to said variable reactance elements a preset bias corresponding to a received frequency band superimposed on said control signal.

9. An automatic tuning radio receiver, comprising variable reactance elements inserted in tuning circuits, means to electronically vary the reactance value of said variable reactance elements, charge-dischage control circuit means controlled by a received signal, said control circuit means controlling the charge and discharge of the integrating circuit, the output of said control circuit being integrated by the integrating circuit, buffer amplifier means supplying to said variable reactance elements a control signal produced in accordance with the voltage of said integrating circuit whereby the tuning is swept over a frequency range, an automatic sweep retuning circuit for maintaining said control signal within a predetermined sweep width, and circuit means supplying to said variable reactance elements a received frequency band setting bias superimposed on said control signal.

UNITED STATES PATENT OFFICE
CERTIFICATE OF CORRECTION

Patent No. 3,588,706 Dated June 28, 1971

Inventor(s) Yasuhide SAKAI et al

It is certified that error appears in the above-identified patent and that said Letters Patent are hereby corrected as shown below:

In the Claim for Convention Priority, the third document -- Japanese Patent Application N° 72337/67 filed November 7, 1967 -- should be included.

Signed and sealed this 11th day of January 1972.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
☆ U.S. GOVERNMENT PRINTING OFFICE : 1969 O—366-334